United States Patent
Sasaki et al.

[11] Patent Number: 5,959,351
[45] Date of Patent: Sep. 28, 1999

[54] LIQUID-COOLED ELECTRONIC DEVICE

[75] Inventors: Shigeyuki Sasaki; Tadakatsu Nakajima, both of Ibaraki-ken; Noriyuki Ashiwake, Tsuchiura; Yasuo Ohsone, Tsuchiura; Toshio Hatada, Tsuchiura; Toshiki Iino, Ibaraki-ken; Akio Idei; Kenichi Kasai, both of Hadano, all of Japan

[73] Assignee: Hitachi, Ltd., Tokyo, Japan

[21] Appl. No.: 08/103,227

[22] Filed: Aug. 9, 1993

[30] Foreign Application Priority Data

Sep. 4, 1992 [JP] Japan .................................. 4-236828

[51] Int. Cl.⁶ .................................................. H01L 23/34
[52] U.S. Cl. ............................................. 257/714; 361/699
[58] Field of Search .................................... 257/712, 713, 257/714, 715, 716; 361/689, 699

[56] References Cited

U.S. PATENT DOCUMENTS

| | | | |
|---|---|---|---|
| 4,783,721 | 11/1988 | Yamamoto et al. | 257/714 |
| 5,023,695 | 6/1991 | Omezawa et al. | 257/718 |
| 5,103,374 | 4/1992 | Azar | 361/689 |
| 5,166,863 | 11/1992 | Shmunis | 257/714 |
| 5,206,791 | 4/1993 | Novotny | 257/715 |
| 5,270,572 | 12/1993 | Nakajima et al. | 257/715 |

FOREIGN PATENT DOCUMENTS

| | | |
|---|---|---|
| 0 480 750 A2 | of 0000 | European Pat. Off. |
| 2-197155 | of 0000 | Japan . |
| 2-298054 | of 0000 | Japan . |
| 3-30457 | of 0000 | Japan . |
| 3-61350 | of 0000 | Japan . |
| 4-206556 | of 0000 | Japan . |

OTHER PUBLICATIONS

IBM Technical Disclosure Bulletin, vol. 34, No. 3, Aug. 1991, pp. 300–301.

*Primary Examiner*—Teresa M. Arroyo
*Attorney, Agent, or Firm*—Evenson, McKeown, Edwards & Lenahan, P.L.L.C.

[57] ABSTRACT

There is disclosed a liquid-cooled electronic device. Semiconductor devices are mounted on a substrate of a semiconductor module immersed in a cooling liquid. A wire-like member is provided in the vicinity of a cooling medium ejection port of each cooling medium supply member which cools a respective one of the semiconductor devices by a jet of the cooling liquid. With this arrangement, the flow of the cooling liquid downstream of the wire-like member is disturbed to promote the boiling over the entire surface of the semiconductor device, and when the semiconductor device is to be cooled, a transient temperature rise is reduced at the time of starting the energization of the semiconductor device, thereby stabilizing the temperature of the semiconductor device.

20 Claims, 12 Drawing Sheets

LIQUID-COOLED ELECTRONIC DEVICE

BACKGROUND OF THE INVENTION

This invention relates to means for cooling a high heat flux device or element such as a semiconductor device, and more particularly to a liquid-cooled electronic device which effectively eliminates heat generated from a semiconductor device used, for example, in a high-speed computer.

Recently, a high-speed design has been increasingly required for computers, and there have been developed methods of mounting a large-scale semiconductor integrations at a high density. Therefore, an amount of heat generated from semiconductor devices has become enormous, and it has become more and more important to efficiently cool the semiconductor devices. Under the circumstances, a conventional cooling device for achieving a high cooling ability is proposed in Japanese Utility Model Unexamined Publication No. 3-61350, in which semiconductor devices generating intense heat are cooled by a forced convection/boiling heat transfer which is a combination of heat transfer by force convection and heat transfer with boiling. As shown in FIG. 15, a cooling medium is ejected onto a back surface (cooling surface) of each of a number of semiconductor devices 3 (which are mounted on a substrate 1) from a cooling medium ejection port 6 provided at a distal end of a respective one of cooling medium supply members 5 communicated with a cooling medium supply header 4.

Japanese Patent Unexamined Publication No. 2-197155 discloses a structure in which holes are formed on a cold plate, and a jet of cooling medium is supplied into each hole by a tapered nozzle.

In the prior technique disclosed in the above Japanese Utility Model Unexamined Publication No. 3-61350, the low-boiling cooling medium having a low-boiling point is ejected from the cooling medium ejection port to the semiconductor device to cool the same through boiling. In this cooling structure, however, when power is put into the semiconductor device is turned on, the temperature of the semiconductor device does not rise ideally (an ideal temperature rise is shown in FIG. 14A), but overshoots transiently as shown in FIG. 14B, which is undesirable.

More specifically, since the pressure of the cooling medium at a jet-impinging area of the semiconductor device (which is generally twice larger in diameter than the ejection port) is higher than at end portions of the semiconductor device, the boiling which develops immediately after the power is turned on does not rapidly spread to the cooling medium-impinging area, so that the overall temperature of the semiconductor device is raised. Therefore, at this time, the temperature of the semiconductor device once rises abruptly. Because of this temperature rise, the cooling medium reaches the boiling point, and the boiling starts also at the impinging area. As a result, bubbles are produced from the entire surface of the semiconductor device to produce a fine convection to abruptly increase a heat transfer rate. Then, finally, a thermal equilibrium is established, so that a steady operating temperature is achieved and maintained.

The transient temperature change at this time causes the semiconductor device to repeatedly undergo a thermal stress, thereby imparting a mechanical damage to the semiconductor device to lower its reliability. Where the temperature change is large, the semiconductor device may be broken. Furthermore, in each semiconductor device, the heat transfer rate is lower at its jet-impinging area than at the other areas, and therefore the temperature becomes higher at this impinging area, so that the temperature does not become uniform over the entire area of the semiconductor device, and a temperature gradient developing at the impinging area adversely affects electrical properties. This has been the greatest obstacle to computers requiring a high-speed operation.

As described above, in the above prior arts, no consideration has been given to the reduction of the transient temperature change developing in the semiconductor device generating intense heat, and therefore such prior arts have not been satisfactory in the cooling ability.

SUMMARY OF THE INVENTION

It is an object of the invention to provide an electronic device cooled by a liquid, in which a transient temperature rise of a semiconductor device when a power is turned on, as well as a time constant up to a steady operating temperature, is reduced as much as possible, thereby stabilizing the temperature of the semiconductor device.

Another object of the invention is to provide an electronic device cooled by a liquid, in which boiling at an entire surface of a semiconductor device is promoted to render a heat transfer rate of the semiconductor device over its entire surface high and uniform and also to render a temperature profile of the semiconductor device more uniform, thereby lowering the operating temperature of the semiconductor device.

According to a first aspect of the present invention, there is provided a liquid-cooled electronic device comprising:

at least one semiconductor device mounted on a substrate;

a cooling medium supply header for supplying a cooling medium to the at least one semiconductor device;

cooling medium supply means extending from the cooling medium supply header for ejecting the cooling medium to a back surface of the semiconductor device, the cooling medium supply means having a cooling medium ejection port; and a transverse member mounted substantially perpendicularly across a flow of the cooling medium.

According to a second aspect of the invention, there is provided a liquid-cooled electronic device comprising:

at least one semiconductor device mounted on a substrate;

a cooling medium supply header for supplying a cooling medium to the at least one semiconductor device;

cooling medium supply means extending from the cooling medium supply header for ejecting the cooling medium to a back surface of the semiconductor device, the cooling medium supply means having a cooling medium ejection port; and separation vortex generating means for forming a separation vortex in a main flow of the cooling medium ejected from the cooling medium ejection port, the separation vortex generating means being disposed at such a position that the separation vortex substantially reaches the back surface of the semiconductor device.

According to a third aspect of the invention, there is provided a liquid-cooled electronic device comprising:

at least one semiconductor device mounted on a substrate;

a cooling medium supply header for supplying a cooling medium to the at least one semiconductor device;

cooling medium supply means extending from the cooling medium supply header for ejecting the cooling medium to a back surface of the semiconductor device, the cooling medium supply means having a cooling medium ejection port; and turbulence generating means for forming a turbulence in a main flow of the cooling medium ejected from the cooling medium ejection port, the turbulence generating means being disposed at such a position that the turbulence substantially reaches the back surface of the semiconductor device.

In the present invention, the cooling medium distributed from the cooling medium supply header to the cooling medium supply member is accelerated because the cross-sectional area of the flow passage thereof is constricted or reduced. Then, part of the flow of the cooling medium impinges on the wire-like member or the projection provided in the flow passage, so that a vigorous turbulence is formed in the flow downstream of this member. The jet of the cooling medium liquid, which is ejected from the cooling medium ejection port and is kept in the thus disturbed condition to a certain degree, impinges on the back surface (cooling surface) of the semiconductor device. Then, the cooling medium flows radially from the impinging area over the back surface of the semiconductor device while forming a very thin thermal boundary layer. The turbulence of the main flow also produces fine convections even at the impinging area where the static pressure rises, thereby promoting the boiling at the impinging area where the boiling cannot easily develop. As a result, when the heat generation of the semiconductor device begins, bubbles are rapidly produced from the entire surface of the semiconductor device, thereby achieving a high heat transfer rate. Furthermore, the temperature of the semiconductor device is prevented from abruptly rising transiently.

By promoting the boiling from the entire surface of the semiconductor device, the heat transfer rate over the entire surface of the semiconductor device is made high and uniform, so that the temperature of the semiconductor device can be made low and uniform.

DESCRIPTION OF THE PREFERRED EMBODIMENTS

A preferred embodiment of the present invention will now be described with reference to the drawings.

Figure 1:
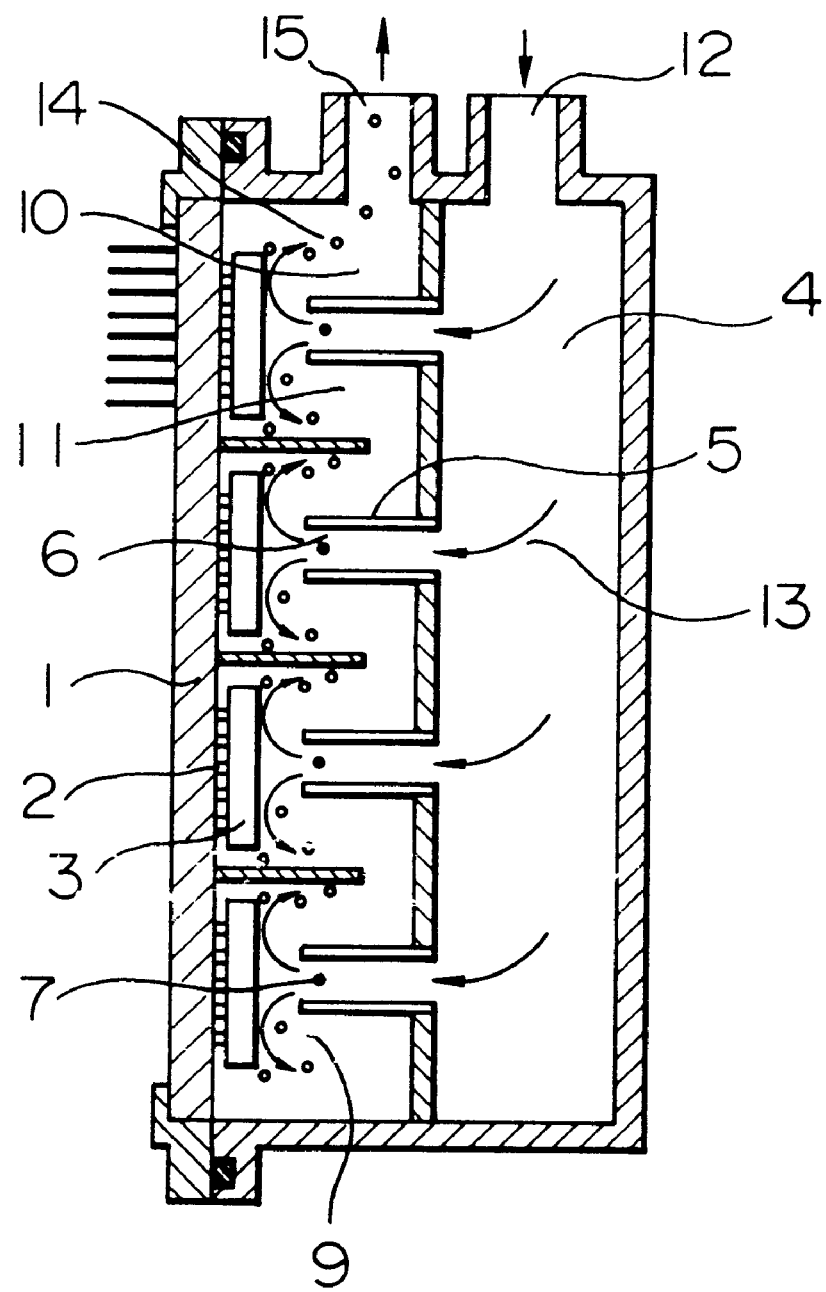
FIG. 1 is a longitudinal cross-sectional view of one embodiment of an electronic device of the present invention.
Figure 2:
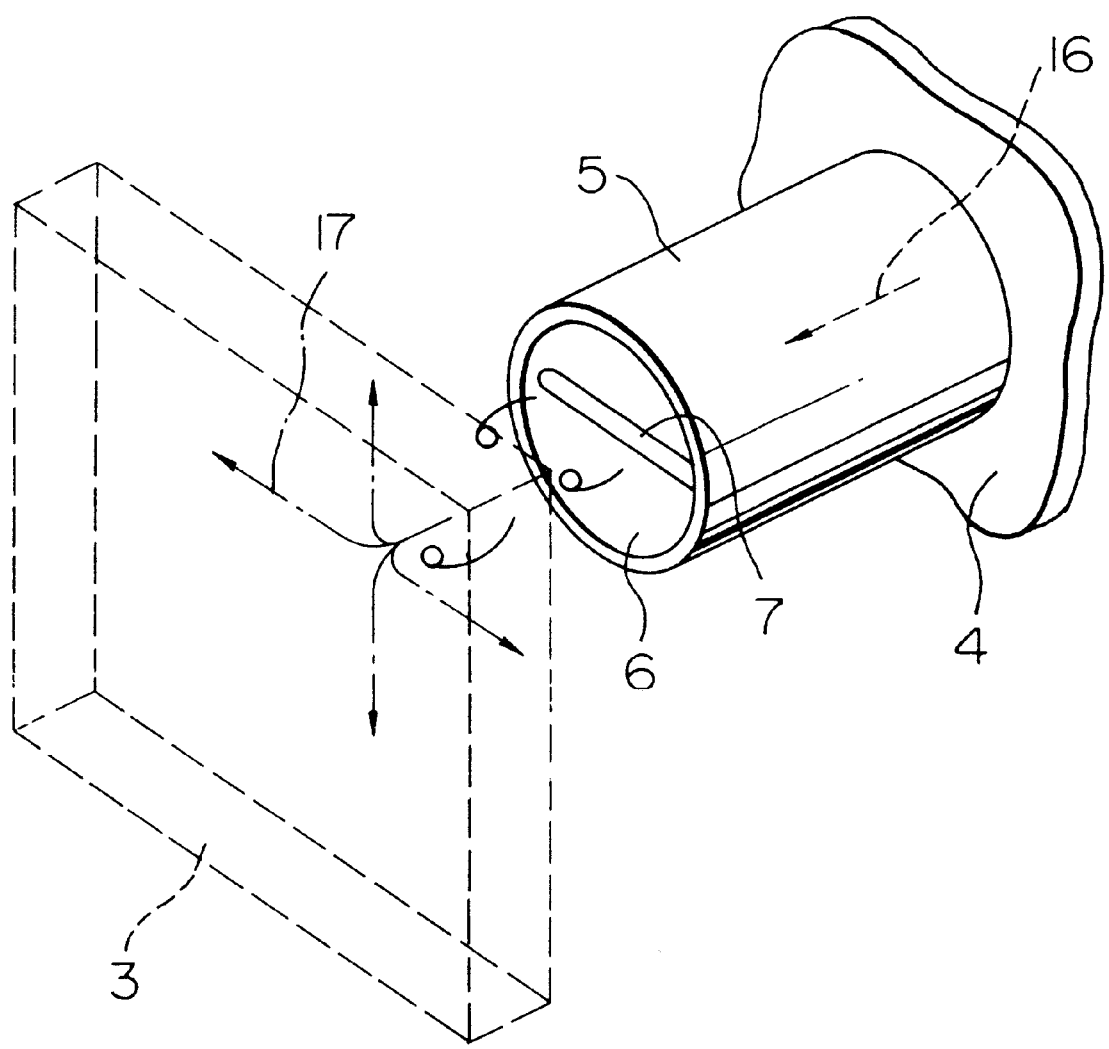
FIG. 2 is an enlarged perspective view of a cooling medium supply member of the electronic device.

Referring to FIGS. 1 and 2, a number of semiconductor devices 3 such as LSI chips are mounted on a multi-layer circuit substrate 1 of a ceramics material through electrical connection members 2, and cooling medium supply members 5 of a tubular configuration communicated with a cooling medium supply header 4 are projected from this header 4 toward the semiconductor devices 3, respectively. A cooling medium ejection port 6 is formed at a distal end of each of the cooling medium supply members 5. A wire-like transverse member 7 is mounted within each cooling medium supply member 5 adjacent to the cooling medium ejection port 6, and extends perpendicularly to a main stream or flow of a cooling medium passing through the supply member 5, a projected area of the wire-like transverse member 7 being smaller than the cross-sectional area of the flow passage of the cooling medium supply member 5. With this arrangement, the cooling medium supply member 5 has a portion which is different in cross-section shape than the remainder. Here, where the cross-sectional shape of the cooling medium supply member changes similarly, it has the same cross-sectional shape. Semiconductor device cooling chambers 9 each receiving a respective one of the semiconductor devices 3 are provided, and a cooling medium return header 10 is provided between these chambers 9 and the cooling medium supply header 4. Each of the semiconductor device cooling chambers 9 is communicated with the cooling medium return header 10 at the opposite side to the semiconductor.

A cooling liquid 13 is introduced from a cooling medium supply pipe 12 into the cooling medium supply header 4, and is distributed to the cooling medium supply members 5, and then is ejected as a jet onto the flat surface of each semiconductor device. The cooling liquid 13 is a supercoolable liquid which has a boiling point lower than that of the semiconductor device, and has an excellent electrically-insulating property. A representative example of the cooling liquid 13 is fluorocarbon. The jet of the cooling liquid, after impinging on the semiconductor device 3, changes its direction of flow at an angle of 90 degrees to radially flow over the flat surface of the semiconductor device. At this time, the cooling liquid receives heat from the semiconductor device 13, and therefore is heated, and flows radially while producing bubbles 14. The cooling liquid containing the bubbles 14 flows from each semiconductor cooling chamber 9 into the cooling medium return header 10, and is discharged to the exterior of a cooling module via a cooling medium return pipe 15.

The operation of the present invention will now be described with reference to FIG. 2. FIG. 2 is a detailed view showing one semiconductor device 3 and its mating cooling medium supply member 5 communicated with the cooling medium supply header 4. The flow 16 of the cooling liquid 13 distributed from the cooling medium supply header 4 to the cooling medium supply member 5 is accelerated because the cross-sectional area of the flow passage thereof is constricted or reduced. Then, part of the flow 16 of the cooling liquid 13 impinges on the wire-like transverse member 7 provided in the flow passage, so that a separation vortex or eddy is formed in the flow downstream of this wire-like transverse member 7, thereby vigorously disturbing the flow. The jet of the cooling liquid, which is ejected from the cooling medium ejection port 6 and is kept in the thus disturbed condition to a certain degree, reaches the back surface (cooling surface) of the semiconductor device 3, and flows radially as at 17 from the impinging area over the back surface while forming a very thin thermal boundary layer. The turbulence of the main flow promotes the boiling at the impinging area. More specifically, the static pressure rises at a stagnation point, and the saturation temperature of the cooling liquid rises, so that the boiling does not occur relatively easily. Despite this, fine convection currents, having bubbles contained therein as a result of the impingement, are produced to thereby promote the boiling. As a result, when the semiconductor devices 3 are energized, bubbles can rapidly be generated from the entire surface of the semiconductor device to achieve a high heat transfer rate, thereby restraining the temperature of the semiconductor device from abruptly rising transiently.

Figure 3:
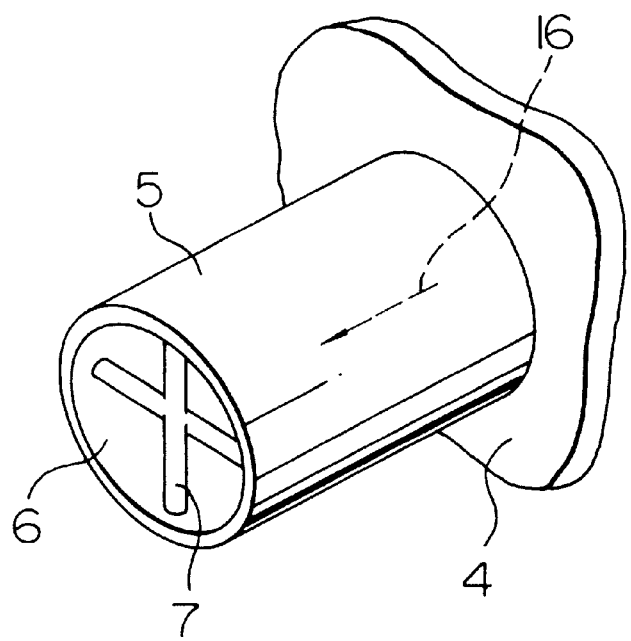
FIGS. 3 to 9 are enlarged perspective views of modified cooling medium supply members, respectively.

FIG. 3 shows a modified cooling medium supply member 5 of the invention. In this embodiment, instead of the wire-like transverse member 7 of FIG. 2, a cross-shaped wire-like transverse member 7 is mounted within the cooling medium supply member 5. With this construction, the cross-shaped wire-like transverse member 7 can produce turbulence, which are symmetrical with respect to the jet-impinging area, on the flat surface of the semiconductor device 3 which is usually of a square shape. Therefore, a more uniform boiling can be promoted on the surface of the semiconductor device 3.

Figure 4:
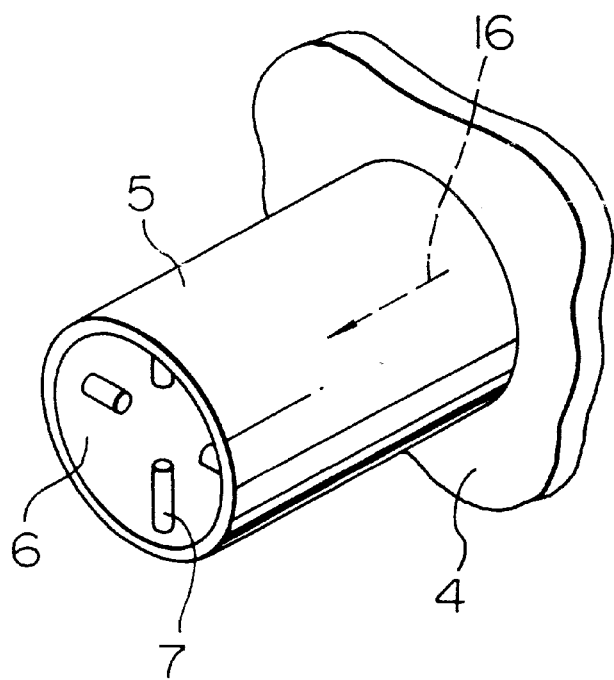

FIG. 4 shows another modified cooling medium supply member 5 of the invention. In this embodiment, a central portion of the cross-shaped wire-like transverse member 7 of FIG. 3 (which is disposed at the central portion of the flow passage of the cooling medium supply member 5 where the velocity of flow 16 of the cooling liquid 13 is the highest) is removed. With this arrangement, the jet of the highest velocity can be ejected onto the semiconductor device 3, so that the thickness of the thermal boundary layer on the flat surface of the semiconductor device 3 can be reduced. Therefore, a high heat transfer rate can be achieved on the flat surface of the semiconductor device.

Another advantage is that since the projected area of the wire-like transverse member 7 is reduced, a pressure loss can be reduced.

Figure 5:
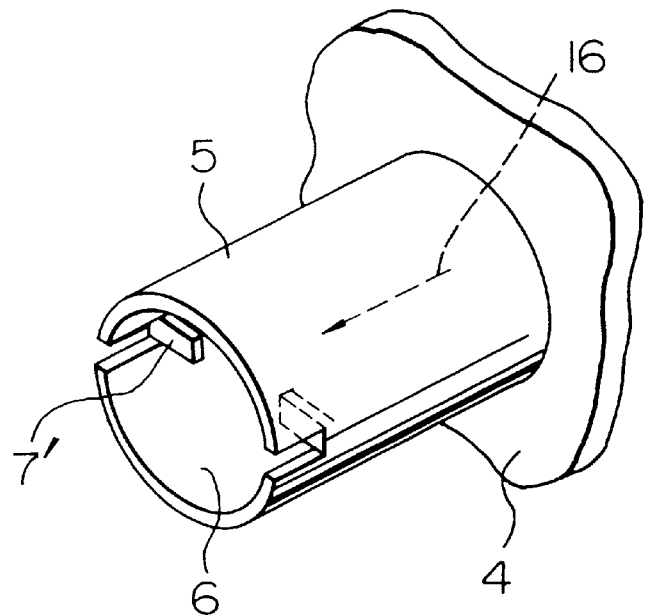

FIG. 5 shows a further modified cooling medium supply member 5 of the invention. In this embodiment, the cooling medium supply member 5 is so processed or worked as to achieve similar effects as described above. More specifically, notches are formed parallel in a plurality of portions of the cooling medium ejection port 6, and these notched portions are bent toward the flow passage at an angle of 90 degrees to form projections 7' constituting a transverse member. With this construction, any other member does not need to be added to the cooling medium supply member 5, and therefore the number of component parts can be reduced.

Figure 6:
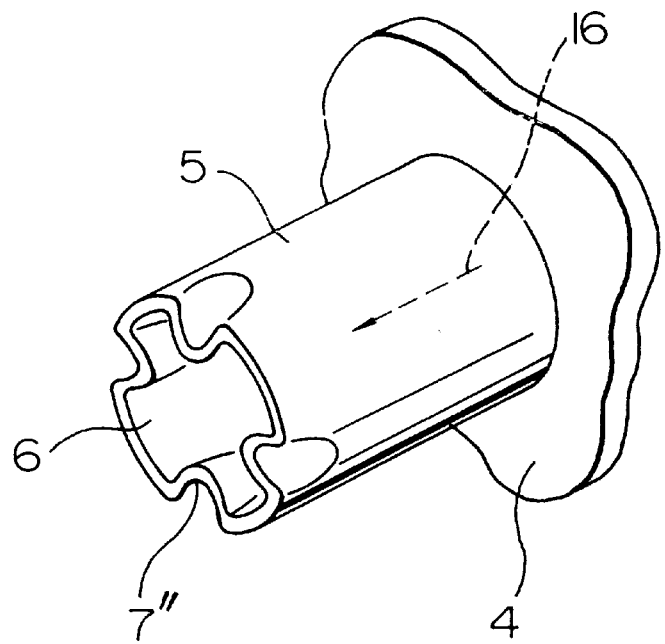

Instead of forming notches in the cooling medium ejection port 6, part of the cooling medium ejection port 6 are plastically deformed toward the flow passage to form projections 7" constituting a transverse member, as shown in FIG. 6. By doing so, the flow of the cooling liquid is disturbed, so that a boiling-promoting effect can be achieved.

Figure 7:
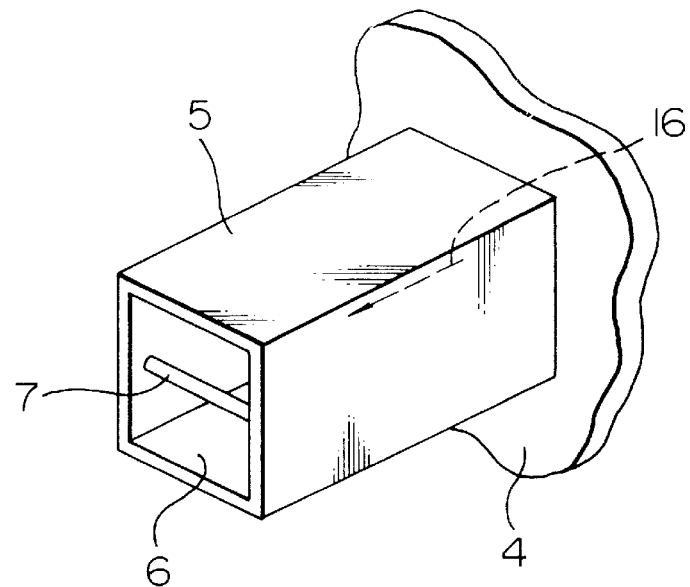

FIG. 7 shows a further modified cooling medium supply member 5 of the invention. The construction of this embodiment is the same as that of FIG. 2 except that the cross-sectional shape of the cooling medium supply member 5 is rectangular. In this embodiment, the jet ejected from the cooling medium supply member 5 comprising a cross-sectionally rectangular tube has swirls caused at the corners of the rectangular tube, and therefore as compared with the cylindrical jet shown in the embodiment of FIG. 2, the heat transference is improved. As a result, the temperature profile in the semiconductor device can be made more uniform.

Figure 8:
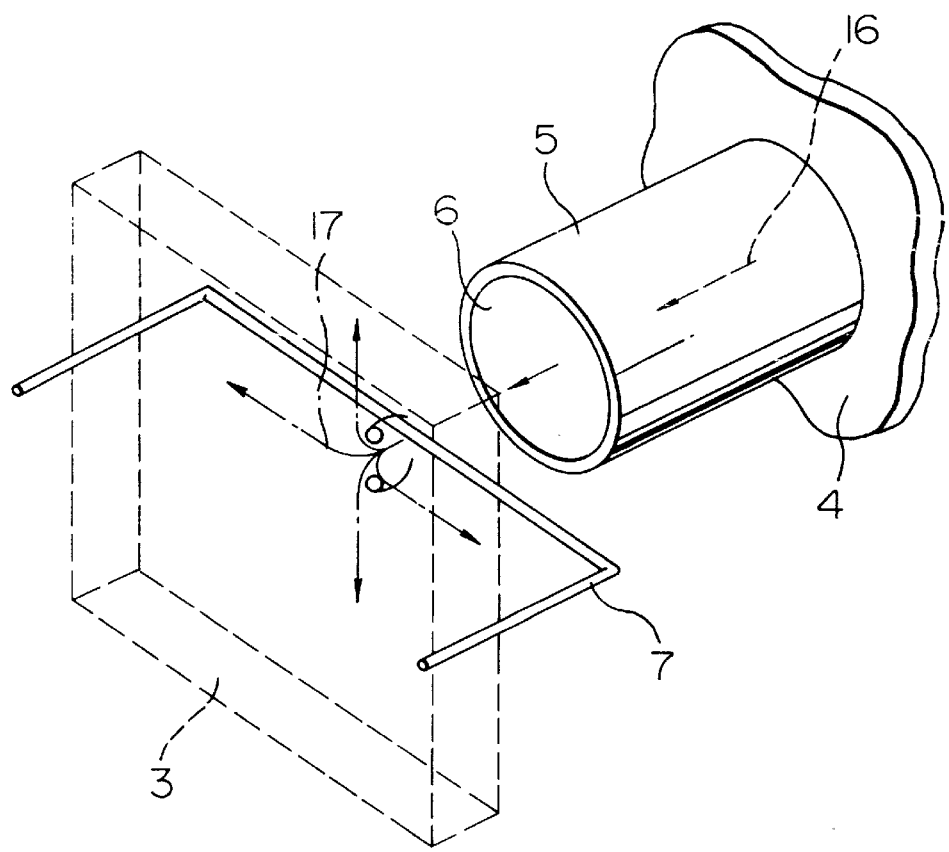

FIG. 8 is a detailed view of a further embodiment of the invention, showing one semiconductor device 3 and its mating cooling medium supply member 5. A wire-like transverse member 7 is provided adjacent to the semiconductor device 3, and a flow 16 of the cooling liquid 13 from the cooling medium supply member 5 is disturbed above the upper surface of the semiconductor device. By doing so, the boiling of the cooling liquid impinging on the surface of the semiconductor device is promoted, thereby achieving similar effects as obtained by providing the projections within the cooling medium supply member 5.

Figure 9:
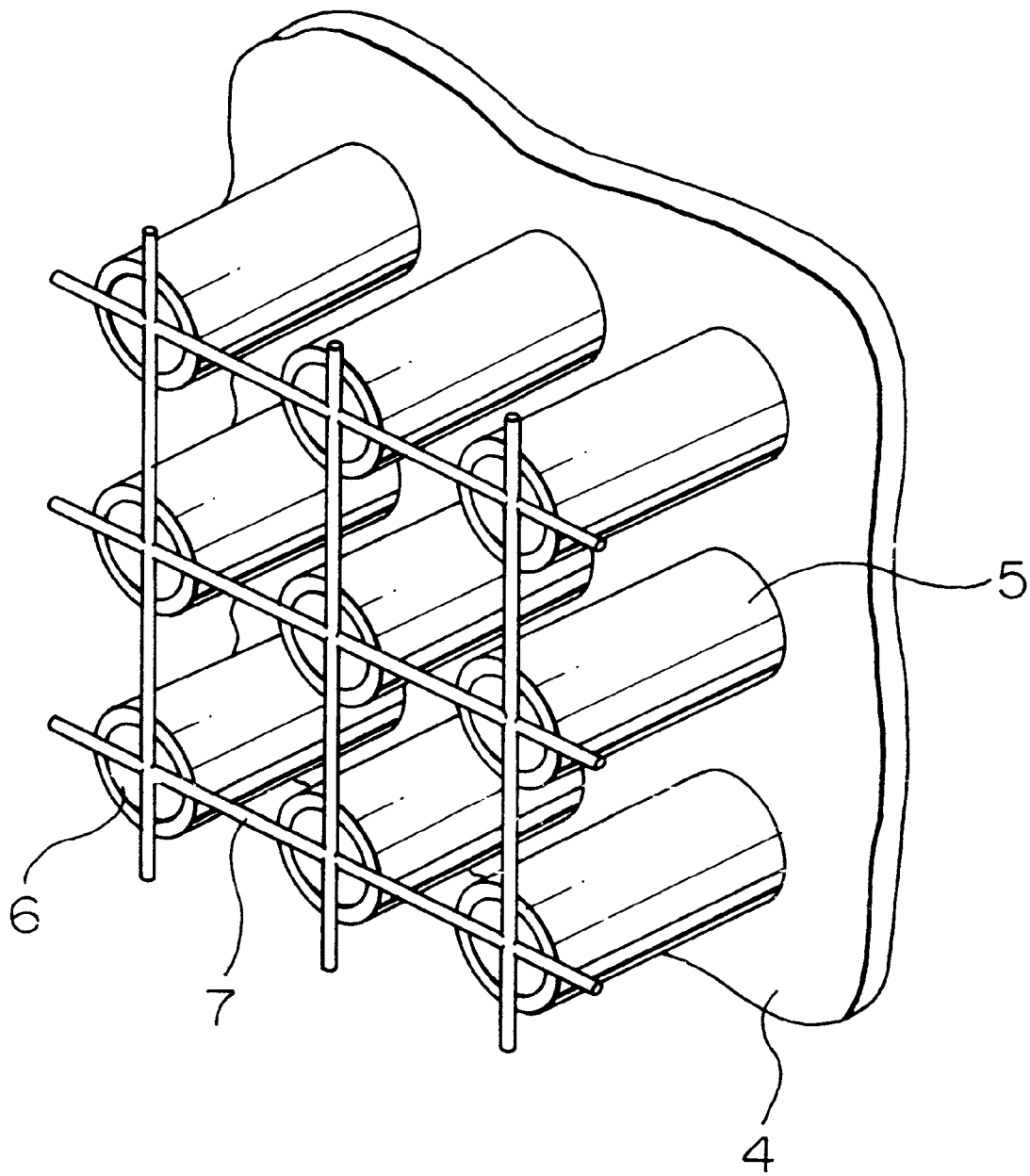

FIG. 9 is a perspective view of a further embodiment of the invention, showing a plurality of cooling medium supply members 5. In this construction, wire-like transverse members 7 are connected together near cooling medium ejection ports 6 of the cooling medium supply members 5 so as to form a lattice and junctions or intersections of this lattice are disposed generally at the centers of the ejection ports 6, respectively. With this construction, the structure can be assembled easily.

Figure 10:
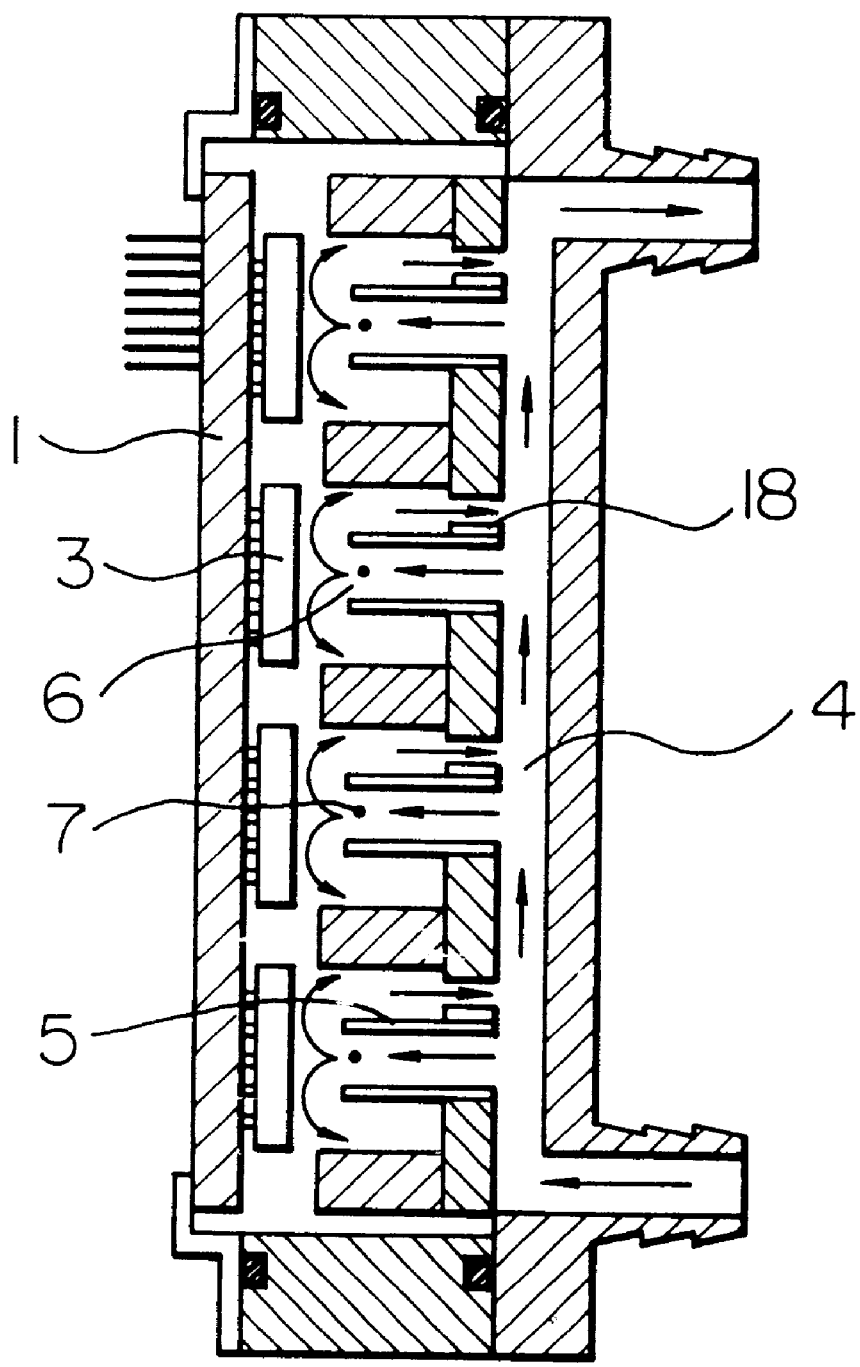
FIG. 10 is a longitudinal cross-sectional view of another embodiment of an electronic device of the present invention.

Referring to FIG. 10, a cooling medium is ejected from a cooling medium supply header 4 to semiconductor devices 3 to cool them, and then is returned to the cooling medium supply header 4 via cooling medium return ports 18 so as to be used again for cooling the semiconductor devices 3 disposed downstream. It should be noted that the cooling medium has swirls caused by the wire-like transverse members 7 in the flow thereof.

Figure 11:
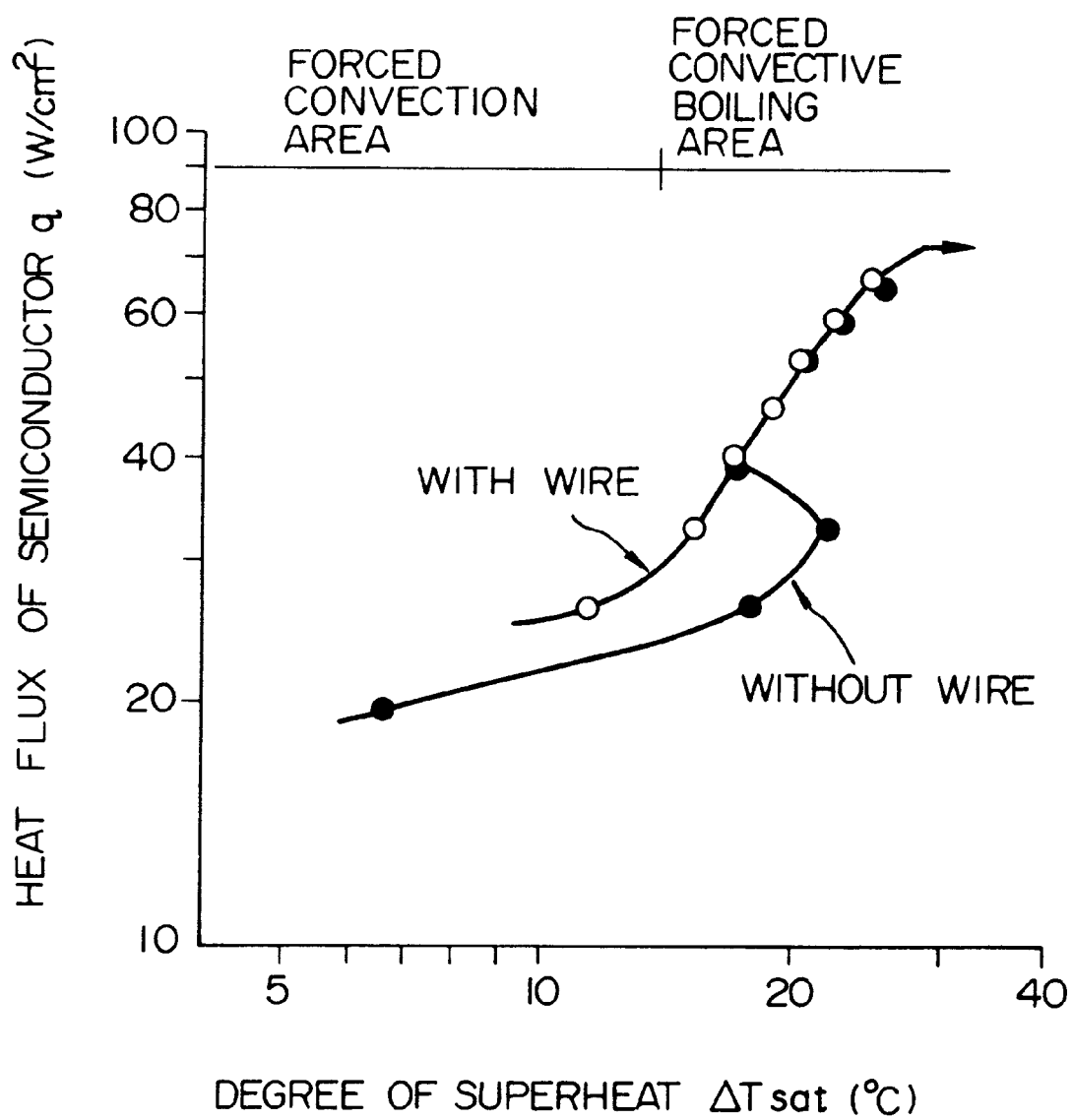
FIGS. 11 to 14 are diagrammatic illustrations showing boiling promoting effects.

FIG. 11 is a graph showing an effect of the present invention. This graph shows a boiling curve obtained when a cross-shaped wire-like transverse member 7 (as shown in FIG. 3) having a diameter of 0.2 mm was mounted within a cooling medium supply member 5 comprising a tube having an inner diameter of 4 mm (Boiling curve obtained with a wire). The average velocity of flow of a cooling liquid through the cooling medium supply member 5 was 1 m/s, and the temperature of the cooling liquid was 26° C. For comparison purposes, the graph also shows a boiling curve obtained by the use of the same cooling medium supply member 5 having no wire-like member (Boiling curve obtained without a wire). The abscissa axis represents the degree of superheat which indicates the difference between the temperature of the central portion of the semiconductor device and the saturation temperature of the cooling liquid. In this example, perfluoro normal hexane having a boiling point of 56° C. was used as the cooling liquid In the case of using no wire-like transverse member 7, as the heat flux of the semiconductor device increased, the temperature of the semiconductor device gradually rose, and when the degree of superheat reached about 22° C., the boiling was suddenly promoted to abruptly lower the temperature, thus causing an unstable phenomenon. Thereafter, when the boiling further developed, the boiling curve abruptly rose right, which indicates that the heat transfer rate was increased by the developed boiling. On the other hand, in the case of providing the wire-like transverse member 7 within the cooling medium supply member 5 (Boiling with a wire), as the heat flux increased, the boiling was gradually promoted, so that there was not encountered an unstable phenomenon causing a temperature drop of the semiconductor device. Thus, the effect achieved by the provision of the wire-like transverse member 7 can be confirmed also from the boiling curves.

Figure 12A:
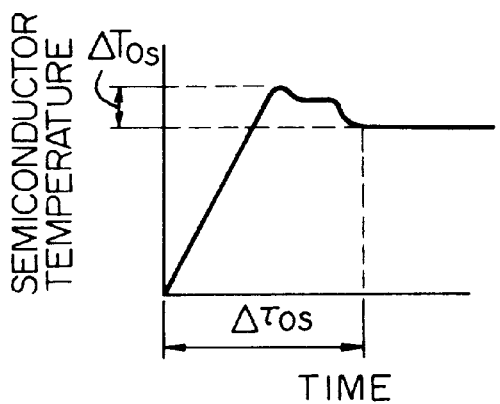
Figure 12B:
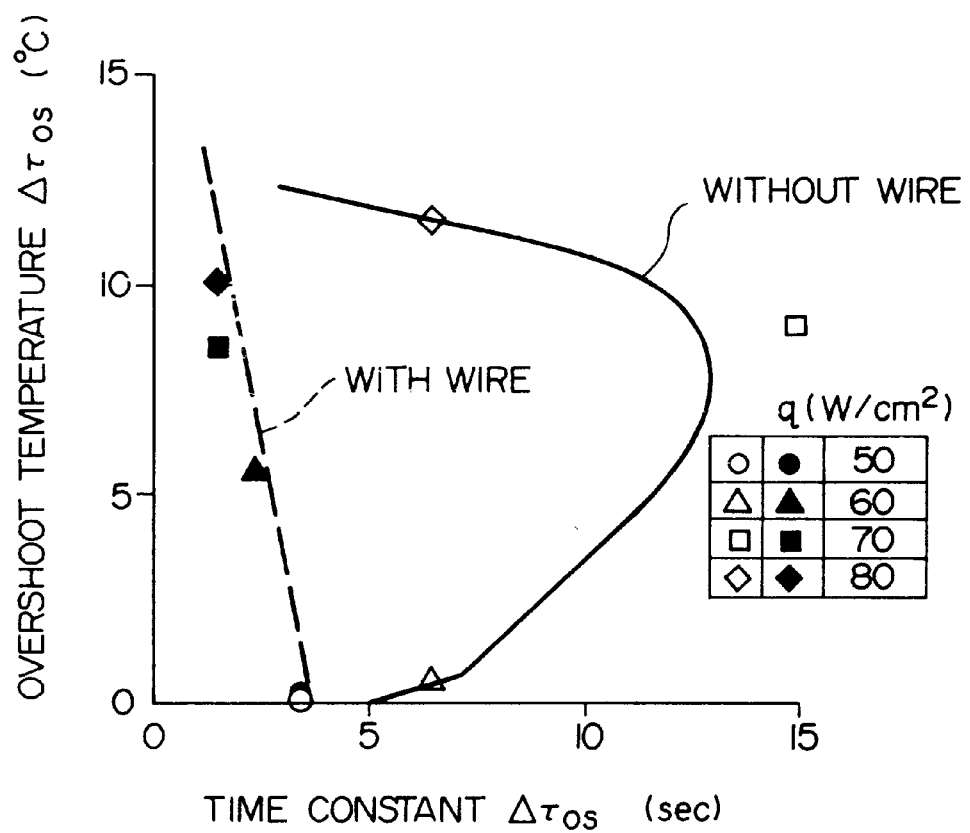

FIG. 12B is a graph showing another effect of the present invention. This graph shows test results obtained when a single straight wire-like transverse member 7 (as shown in FIG. 2) having a diameter of 0.2 mm was mounted within a cooling medium ejection port 6, as shown in FIG. 2 (Results obtained with a wire). A cooling medium supply member 5 had an inner diameter of 2 mm, and the average velocity of flow of a cooling liquid through the cooling medium supply member 5 was 5 m/s, and the temperature of the cooling liquid was 26° C. For comparison purposes, the graph also shows test results obtained by the use of the same cooling medium supply member 5 having no wire-like member (Results obtained without a wire). The abscissa axis represents a time period (time constant) from the energization of the semiconductor device 3 to the time when the temperature of the semiconductor device reaches a steady temperature through a transiently-raised temperature (overshoot) (FIG. 12A) and the maximum temperature causing the boiling. The ordinate axis represents the difference (overshoot temperature) between the maximum temperature at the time of the overshoot and the steady temperature. In FIG. 12B, when a heat flux g is 50 W/cm$^2$, no overshoot is encountered, and in the case of using no wire-like transverse member 7, when the heat flux is about 70 W/cm$^2$, the time constant is the maximum value of about 15 seconds. On the other hand, by providing the single straight wire-like member 7 having a diameter of 0.2 mm, the time constant is extremely improved to about 2 seconds.

Figure 13:
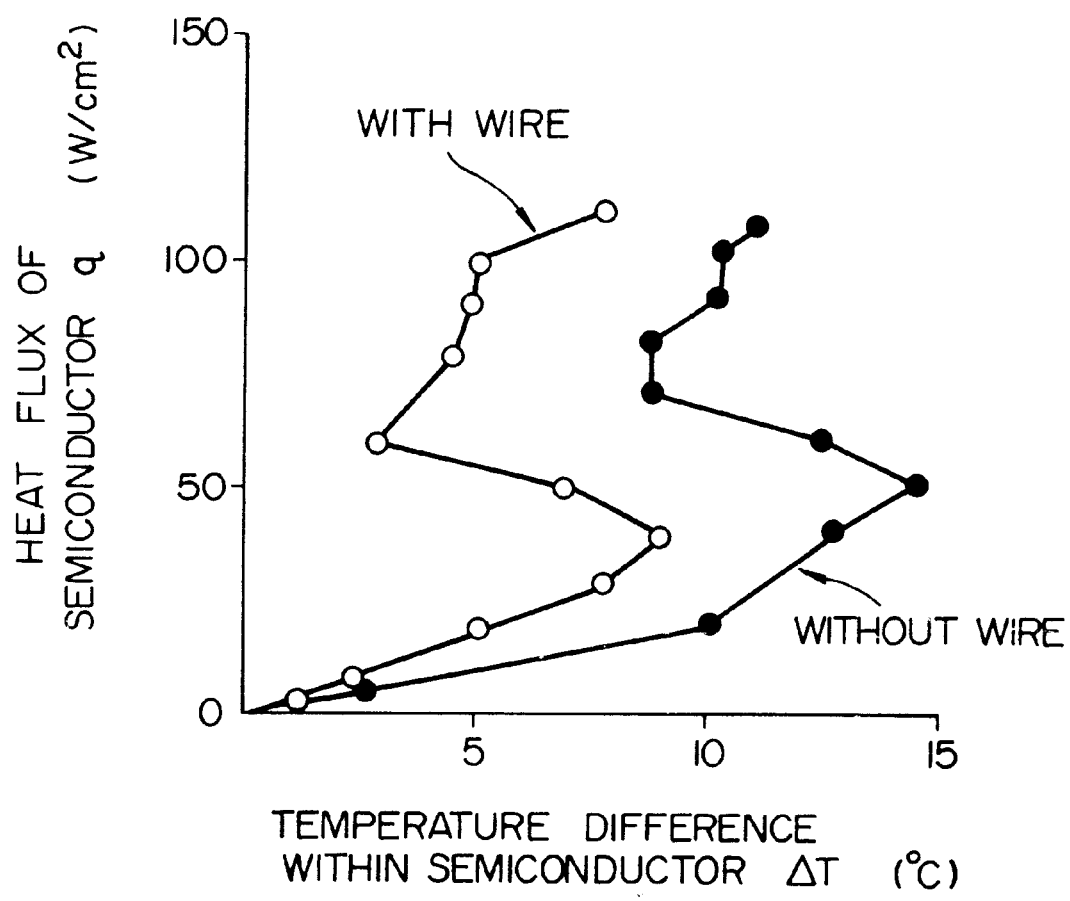
Figure 14A:
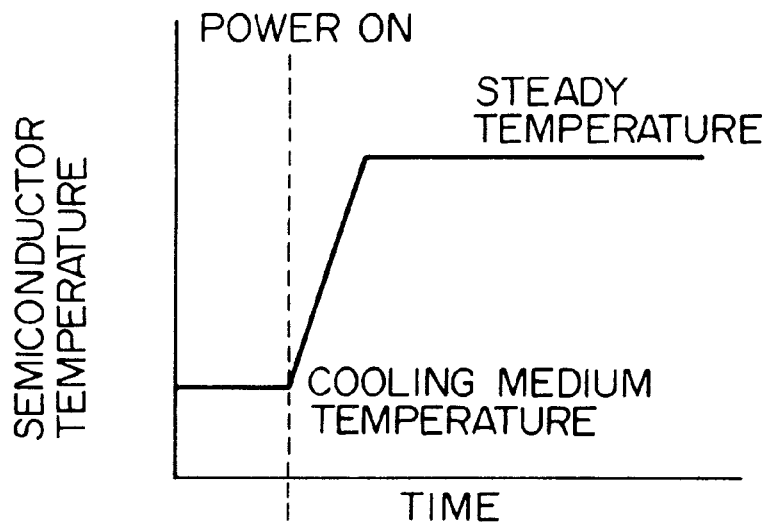
Figure 14B:
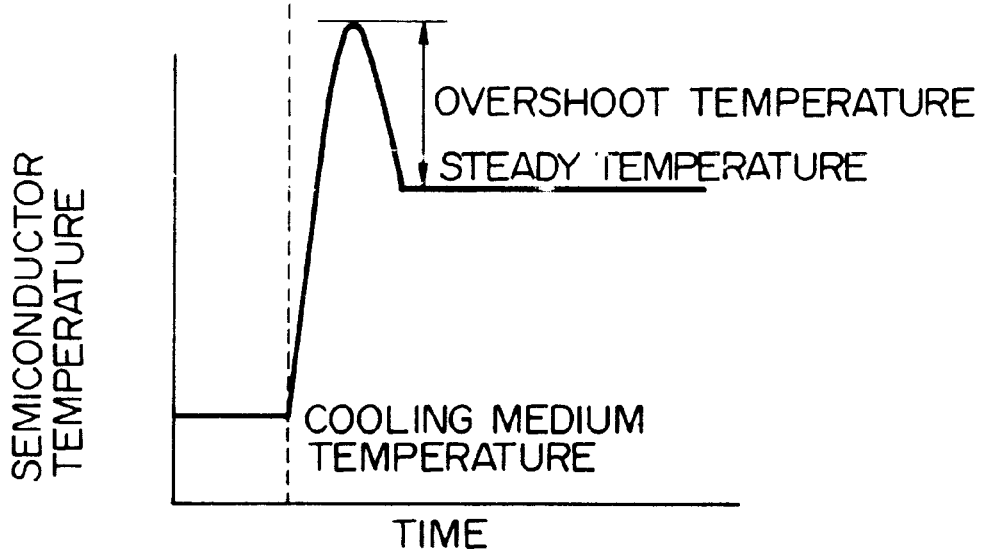
Figure 15:
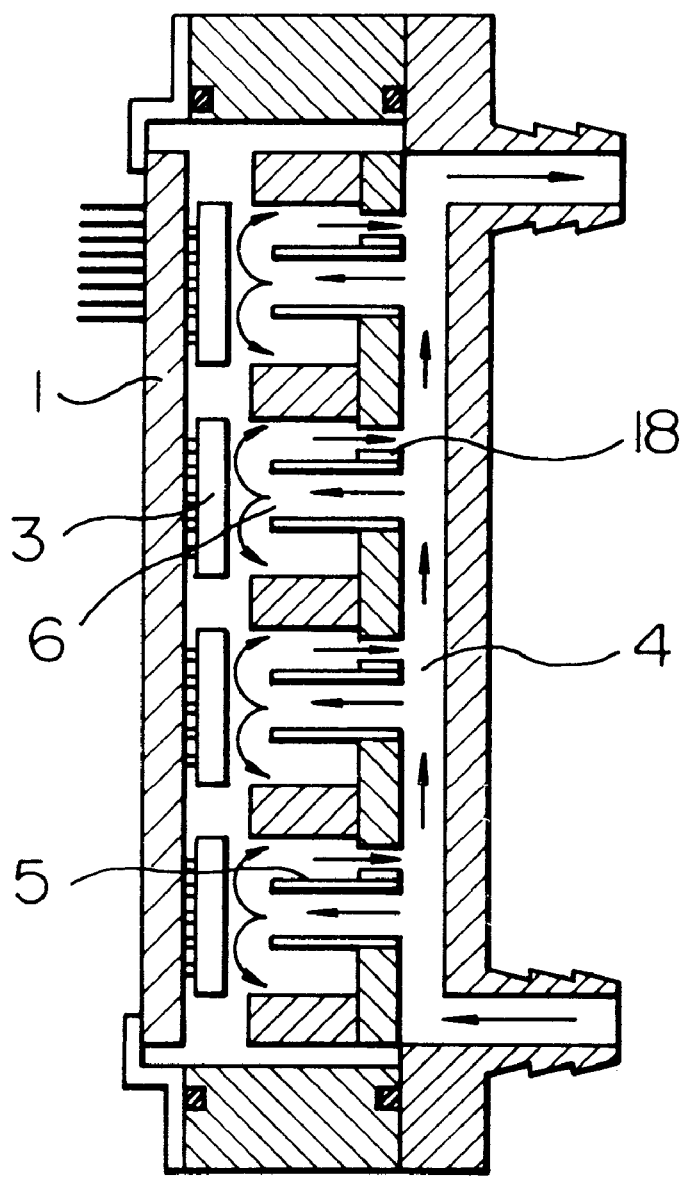
FIG. 15 is a view of the conventional electronic device cooled by a liquid.

FIG. 13 is a graph also showing the other effect of the present invention. This graph shows test results obtained when a single straight wire-like member 7 having a diameter of 0.2 mm was mounted within a cooling medium ejection port 6, as shown in FIG. 2 (Results obtained with a wire). A cooling medium supply member 5 had an inner diameter of 2 mm, and the average velocity of flow of a cooling liquid through the cooling medium supply member 5 was 6 m/s, and the temperature of the cooling liquid was 26° C. For comparison purposes, the graph also shows test results obtained by the use of the same cooling medium supply member 5 having no wire-like member (Results obtained without a wire). The abscissa axis represents a temperature difference between the maximum temperature and the minimum temperature within a semiconductor device. The ordinate axis represents a heat flux of the semiconductor device. In those areas where the heat flux is relatively low, and a forced convection is predominant, the temperature difference within the semiconductor device increases linearly, and when the boiling starts at a certain point, the temperature difference abruptly decreases. When the heat flux is further increased to 60~70 W/cm$^2$, the temperature difference tends to increase again. It will be appreciated from these results that by providing the single straight wire-like transverse member 7 with a diameter of 0.2 mm, the boiling is rapidly promoted to make the heat transfer rate within the semiconductor device uniform, thereby reducing the temperature difference.

In the above embodiments, the material of the wire-like member 7 has not been specified; however, when it comprises a temperature-sensing element such as a thermistor, the temperature of the cooling medium flowing through the cooling medium supply member 5 can be measured. Furthermore, by beforehand calibrating indicated values of this temperature and the flow velocity of the cooling medium, there is obtained the function of a flowmeter. By doing so, a malfunction of a pump for the cooling medium, a malfunction of a liquid cooling device, abnormality of the liquid circulation system, and etc., can be easily detected, and besides the distribution of the cooling medium from the cooling medium supply header 4 to the plurality of cooling medium supply members 5 can be measured.

Where the wire-like member 7 is made of an electrically-conductive material such as metal, the boiling of the semiconductor device 3 can be further promoted. More specifically, the wire-like member 7 is directly energized by pulses to be heated to such an extent as not to raise the temperature of a main flow of the cooling medium, thereby producing bubbles through boiling. Then, these bubbles are caused by jets to impinge on the back surface of the semiconductor device 3 to promote fine convections of the cooling medium, thereby promoting the boiling.

In the present invention, part of the cooling medium flowing through the cooling medium supply member impinges on the wire-like member or the projection-like member provided within the flow passage, so that the flow is vigorously disturbed downstream of the wire-like or the projection-like member, and fine convections are produced in the impinging area where the boiling does not easily develop, thereby promoting the boiling. As a result, when the heat generation of the semiconductor device begins, bubbles are immediately produced, thereby achieving a high heat transfer rate.

What is claimed is:

1. A liquid-cooled electronic device comprising:
   at least one semiconductor device mounted on a substrate;
   a cooling medium supply header for supplying a cooling medium to said at least one semiconductor device;
   cooling medium supply means extending from said cooling medium supply header, for ejecting said cooling medium to a back surface of said semiconductor device, said cooling medium supply means having a cooling medium ejector port; and
   a transverse member mounted adjacent the cooling medium ejection port and across a flow of said cooling medium, said transverse member being configured to form a separation eddy downstream thereof.

2. A liquid-cooled electronic device according to claim 1, wherein said semiconductor device comprises an LSI chip.

3. A liquid-cooled electronic device according to claim 1, wherein said transverse member comprises one of a wire-like member and a projection.

4. A liquid-cooled electronic device according to claim 3, wherein said cooling medium ejection port has a circular cross-sectional shape, so that the cooling medium ejected from said cooling medium ejection port is in the form of a three-dimensional jet.

5. A liquid-cooled electronic device according to claim 3, wherein said cooling medium ejection port has a rectangular cross-sectional shape.

6. A liquid-cooled electronic device according to claim 3, wherein the axis of said cooling medium ejection port is disposed in a direction normal to the back surface of said semiconductor device.

7. A liquid-cooled electronic device according to claim 1, wherein said cooling medium comprises one of a low-boiling cooling medium and fluorocarbon which have a saturation temperature lower than the temperature of said semiconductor device.

8. A liquid-cooled electronic device according to claim 1, wherein said cooling medium has an electrically-insulating property, and is in the state of a liquid at normal temperatures.

9. A liquid-cooled electronic device comprising:
   at least one semiconductor device mounted on a substrate;
   a cooling medium supply header for supplying a cooling medium to said semiconductor device;
   cooling medium supply means extending from said cooling medium supply header for ejecting said cooling medium to a back surface of said semiconductor device, said cooling medium supply means having a cooling medium ejector port; and
   separation vortex generating means adjacent the cooling medium ejection port for forming a separation vortex in a main flow of said cooling medium -ejected from said cooling medium ejection port, said separation vortex generating means being disposed such that the separation vortex substantially reaches the back surface of said semiconductor device.

10. A liquid-cooled electronic device according to claim 9, wherein said semiconductor device comprises an LSI chip.

11. A liquid-cooled electronic device according to claim 9, wherein said separation vortex generating means comprises one of a wire-like member and a projection.

12. A liquid-cooled electronic device according to claim 9, wherein said separation vortex generating means is made of a material having a good electrical conductivity.

13. A liquid-cooled electronic device according to claim 9, wherein said separation vortex generating means comprises a temperature-sensing element.

14. A liquid-cooled electronic device comprising:

at least one semiconductor device mounted on a substrate;

a cooling medium supply header for supplying a cooling medium to said semiconductor device which is immersed in the cooling medium;

cooling medium supply means extending from said cooling medium supply header for injecting said cooling medium to a back surface of said semiconductor device, said cooling medium supply means having a cooling medium ejection port; and turbulence generating means adjacent the cooling medium ejection port for forming a turbulence in a main flow of said cooling medium ejected from said cooling medium ejection port, said turbulence generating means being disposed such that the turbulence substantially reaches the back surface of said semiconductor device.

15. A liquid-cooled electronic device according to claim 14, wherein said turbulence generating means comprises one of a wire-like member and a projection.

16. A liquid-cooled electronic device according to claim 14, wherein said semiconductor device comprises an LSI chip.

17. A liquid-cooled electronic device comprising:

a semiconductor device mounted on a substrate; and a cooling medium supply member having an ejection port for immersing said semiconductor device in a liquid and for ejecting said liquid to a back surface of said semiconductor device, said cooling medium supply member having at least two different cross-sectional shapes in a direction of ejection of said liquid and being located adjacent the ejection port.

18. A liquid-cooled electronic device according to claim 17, wherein said semiconductor device comprises an LSI chip.

19. A liquid-cooled electronic device comprising:

at least one semiconductor device mounted on a substrate;

a cooling medium supply member for injecting a cooling medium to a back surface of said at least one semiconductor device; and a member arranged upstream of the back surface adjacent an outlet of the cooling medium supply member and configured for interfering with a flow of said cooling medium from said cooling medium supply member to create turbulence downstream of the outlet and radial flow of said cooling medium over the back surface.

20. A liquid-cooled electronic device according to claim 19, wherein said semiconductor device comprises an LSI.

* * * * *